US009620199B2

(12) United States Patent
Miyano

(10) Patent No.: US 9,620,199 B2
(45) Date of Patent: Apr. 11, 2017

(54) SEMICONDUCTOR STORAGE DEVICE HAVING TFET ACCESS TRANSISTORS AND METHOD OF DRIVING THE SAME

(71) Applicant: Kabushiki Kaisha Toshiba, Minato-ku, Tokyo (JP)

(72) Inventor: Shinji Miyano, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/837,424

(22) Filed: Aug. 27, 2015

(65) Prior Publication Data
US 2016/0196869 A1 Jul. 7, 2016

(30) Foreign Application Priority Data

Jan. 6, 2015 (JP) ................................ 2015-000942

(51) Int. Cl.
| | |
|---|---|
| *G11C 11/00* | (2006.01) |
| *G11C 11/419* | (2006.01) |
| *G11C 11/412* | (2006.01) |
| *G11C 8/14* | (2006.01) |

(52) U.S. Cl.
CPC .......... *G11C 11/419* (2013.01); *G11C 11/412* (2013.01); *G11C 8/14* (2013.01)

(58) Field of Classification Search
CPC .................................................. G11C 11/412
USPC ........................................... 365/154, 230.05
See application file for complete search history.

(56) References Cited

U.S. PATENT DOCUMENTS

| | | | | |
|---|---|---|---|---|
| 5,477,489 | A * | 12/1995 | Wiedmann | G11C 8/16 365/154 |
| 8,872,271 | B2 | 10/2014 | Hokazono | |
| 2006/0227595 | A1* | 10/2006 | Chuang | G11C 11/412 365/154 |
| 2009/0175107 | A1* | 7/2009 | Christensen | G11C 7/12 365/203 |
| 2012/0106236 | A1* | 5/2012 | Singh | G11C 11/412 365/154 |
| 2013/0176770 | A1* | 7/2013 | Chang | G11C 11/412 365/154 |
| 2013/0176771 | A1* | 7/2013 | Chang | G11C 16/24 365/154 |

(Continued)

FOREIGN PATENT DOCUMENTS

JP  2014-072338 A  4/2014

*Primary Examiner* — Hoai V Ho
(74) *Attorney, Agent, or Firm* — Knobbe, Martens, Olson & Bear, LLP

(57) ABSTRACT

According to one embodiment, a semiconductor storage device includes a flip-flop circuit configured with two stages of inverters composed of TFETs. The flip-flop circuit includes first and second nodes. A first access transistor composed of a TFET is provided between the first node and a first write word-line. A second access transistor composed of a TFET is provided between the second node and a second write word-line. A MOS transistor which has a gate connected to the first node and responds to a voltage impressed on a read word-line to supply a voltage corresponding to a potential at the first node to a read bit-line is included. The first and second access transistors are configured with TFETs connected in a manner that a drain current flows from the first and second nodes to a write bit-line when turned on.

20 Claims, 5 Drawing Sheets

(56) References Cited

U.S. PATENT DOCUMENTS

2014/0061808 A1\* 3/2014 Nakatsuka ............ G11C 11/412
 257/368

\* cited by examiner

US 9,620,199 B2

SEMICONDUCTOR STORAGE DEVICE HAVING TFET ACCESS TRANSISTORS AND METHOD OF DRIVING THE SAME

CROSS-REFERENCE TO RELATED APPLICATIONS

This application is based upon and claims the benefit of priority from Japanese Patent Application No. 2015-942, filed on Jan. 6, 2015; the entire contents of which are incorporated herein by reference.

FIELD

Embodiments described herein relate generally to a semiconductor storage device and a method of driving the same.

BACKGROUND

Conventional techniques of constituting a static random access memory (SRAM) using a tunnel transistor, which operates under low-voltage, are known. The tunnel transistor can operate under low-voltage and has unique property such as its small leakage current during the off-state. However, a small drain current during the on-state causes the tunnel transistor to saturate under a voltage where the drain current is relatively low. Under a low drain current, the driving ability is low, and thus the operating speed of the semiconductor storage device is low. Provision of a semiconductor storage device making better use of the property of the tunnel transistor is desired.

DETAILED DESCRIPTION

In general, according to one embodiment, a semiconductor storage device includes a first inverter configured with a tunnel transistor. A first node which receives an output of the first inverter is included. A second inverter configured with a tunnel transistor is included. A second node which receives an output of the second inverter is included. A first access transistor having a source-drain path connected between the first node and a first write bit-line and a gate connected to the write word-line is included. A second access transistor having a source-drain path connected between the second node and a second write bit-line and a gate connected to the write word-line is included. A first MOS transistor circuit which responds to a voltage impressed on a read word-line and supplies a voltage corresponding to the voltage on the first node to a read bit-line is included. The first access transistor is configured with a tunnel transistor connected in a manner that a drain current flows toward the first write bit-line from the first node when turned on. The second access transistor is configured with a tunnel transistor connected in a manner that a drain current flows toward the second write bit-line from the second node when turned on.

Exemplary embodiments of a semiconductor storage device and a method of driving the semiconductor storage device will be described in detail referring to the attached drawings. The invention is not limited to the embodiments.

First Embodiment

Figure 1:
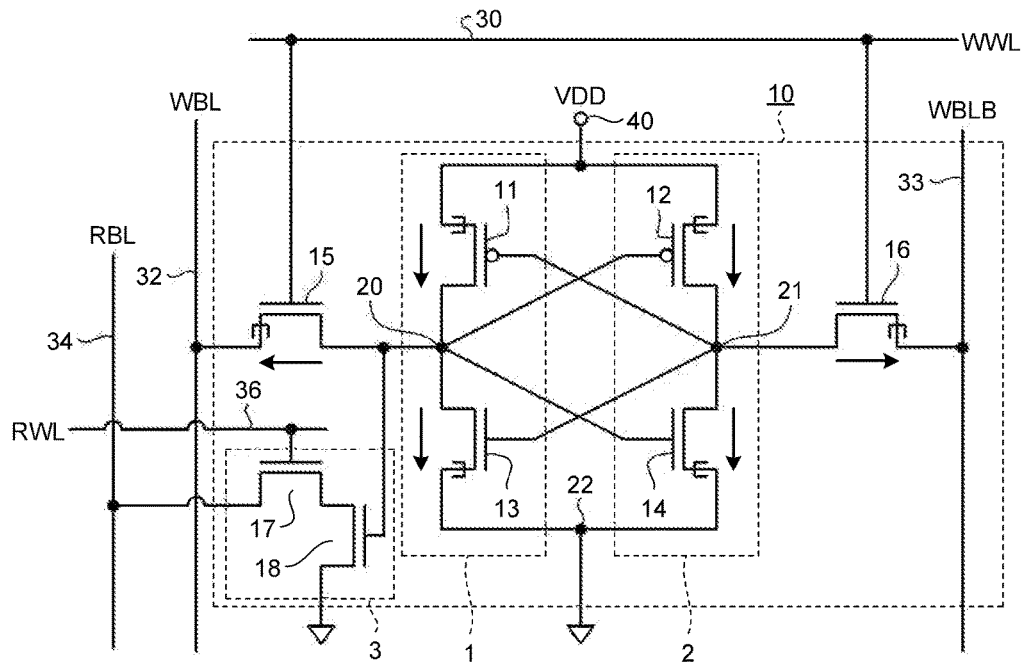
FIG. 1 illustrates a configuration of a memory cell of a semiconductor storage device according to a first embodiment.

FIG. 1 illustrates a configuration of a memory cell of a semiconductor storage device according to a first embodiment. The memory cell 10 according to the embodiment includes an N-type tunnel transistor 13 having the drain connected to a node 20 and the source connected to a node 22. The N-type tunnel transistor 13 has the source region of P-type (not illustrated) and the drain region of N-type (not illustrated), Hereinafter, the N-type tunnel transistor is referred to as NTFET. The memory cell 10 includes an NTFET 14 having the drain connected to a node 21 and the source connected to a node 22. The gate of the NTFET 13 is connected to the node 21 and the gate of the NTFET 14 is connected to the node 20. When the NTFET is turned on by impressing a bias across the source and the drain with the higher potential at the drain (forward-bias), the drain current flows from the drain to the source. The arrow in the figure illustrates the flow direction of the drain current under the forward biased state. The followings are to be construed in a similar manner.

The memory cell 10 includes a P-type tunnel transistor 11 having the drain connected to the node 20 and the source connected to a node 40. The P-type tunnel transistor 11 has the source region of N-type (not illustrated) and the drain region of P-type (not illustrated). When the P-type tunnel transistor is turned on by impressing a bias across the drain and the source with the higher potential on the source (forward-bias), the drain current flows from the source to the drain. The arrow in the figure illustrates the flow direction of the drain current under the forward biased state. The followings are to be construed in a similar manner. Hereinafter, the P-type tunnel transistor is referred to as PTFET. The memory cell 10 includes a PTFET 12 having the drain connected to the node 21 and the source connected to the node 40. The gate of the PTFET 11 is connected to the node 21 and the gate of the PTFET 12 is connected to the node 20. The PTFET 11 and the NTFET 13 constitute an inverter 1. The PTFET 12 and the NTFET 14 constitute an inverter 2. The output of the inverter 1 is input to the inverter 2, and the output of the inverter 2 is fed back to the inverter 1. The inverter 1 and the inverter 2 constitute a flip-flop circuit.

The memory cell 10 includes an access transistor 15 connected between the node 20 and a first write bit-line 32. The access transistor 15 is composed of an NTFET which passes therethrough a current from the node 20 to the first write bit-line 32 when turned on. The arrow in the figure illustrates the flow direction of the current when turned on.

The memory cell 10 includes an access transistor 16 connected between the node 21 and a second write bit-line 33. The access transistor 16 is composed of an NTFET which passes therethrough a current from the node 21 to the second write bit-line 33 when turned on. The arrow in the figure illustrates the flow direction of the current when turned on.

The memory cell 10 includes an MOS transistor circuit 3 which responds to a voltage impressed on a read word-line 36 and supplies a voltage corresponding to the voltage on the first node 20 to a read bit-line 34. The MOS transistor circuit 3 includes an NMOS transistor 18 having the gate connected to the node 20 and the source being grounded. The drain of the NMOS transistor 18 is connected to the source of an NMOS transistor 17 and the drain of the NMOS transistor 17 is connected to the read bit-line 34. The gate of the NMOS transistor 17 is connected to the read word-line 36. The on and off of the NMOS transistor 17 is controlled by the voltage impressed on the read word-line 36.

The memory cell 10 of the semiconductor storage device according to the embodiment includes the flip-flop circuit, configured with the inverter 1 and the inverter 2, to hold data, where the inverter 1 and the inverter 2 are each composed of a TFET. This allows the operation under low-voltage, and thus a power voltage VDD to be supplied can be reduced. The embodiment includes the MOS transistor circuit 3 which responds to a voltage impressed on a read word-line 36 and supplies a voltage corresponding to the voltage on the first node 20 to the read bit-line 34. The MOS transistor circuit 3 includes the NMOS transistor 18 having the gate connected to the node 20 and the NMOS transistor 17 having the gate connected to the read word-line 36 and the drain connected to the read bit-line 34. On and off of the NMOS transistor 17 is controlled by the voltage impressed on the read word-line 36. The NMOS transistor 18 is turned on by the High-level voltage impressed on the node 20. That is, the reading operation is performed using the MOS transistor circuit 3 including the source-drain path of the NMOS transistor 17 and the source-drain path of the NMOS transistor 18 which are connected in series between the read bit-line 34 and the ground voltage. By performing the reading operation using the MOS transistor circuit 3 having high driving ability, the data corresponding to the voltage on the node 20 can quickly be supplied to the read bit-line 34. The reading operation can thus be performed with high speed.

Figure 2:
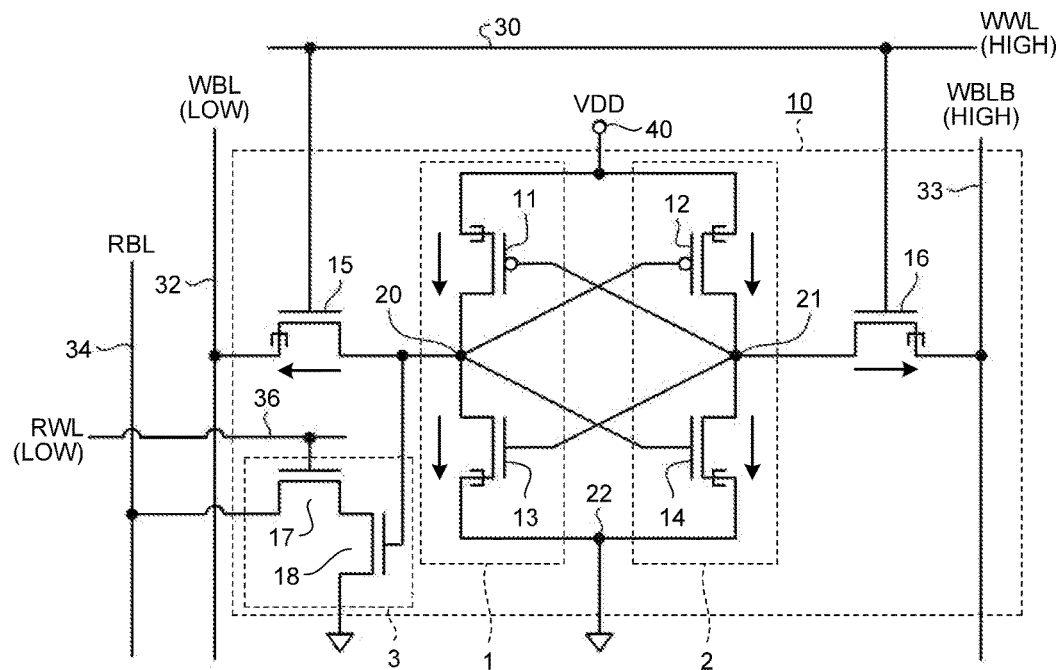
FIG. 2 is a figure for explaining a writing operation.

Operations of the semiconductor storage device will be described below. The writing operation will be described referring to FIG. 2. In the writing operation, a Low-level voltage, for example, a ground voltage VSS, is impressed on the read word-line 36. The NMOS transistor 17 connected to the read bit-line 34 is thereby turned off.

In the writing operation, a High-level voltage, for example, the power voltage VDD, is impressed on the write word-line 30. The access transistors 15 and 16, each composed of an NTFET having the gate connected to the write word-line 30, are thereby turned on. For example, when a Low-level voltage is impressed on the first write bit-line 32, the access transistor 15 is turned on and the potential of the node 20 is reduced. In this manner, the Low-level data is written in the node 20. At the same time, the NTFET 14 having the gate connected to the node 20 is turned off, and the node 21 becomes High-level.

The writing operation is mainly performed to turn on the access transistors 15 and 16 connected to the write bit-lines 32 and 33, respectively, on which Low-level data is impressed. In the embodiment, the writing operation is performed with the access transistors 15 and 16 which are connected in a manner that a drain current flows from the nodes 20 and 21 to the write bit-lines 32 and 33, respectively, when turned on. The writing operation can thus be performed stably.

Figure 3:
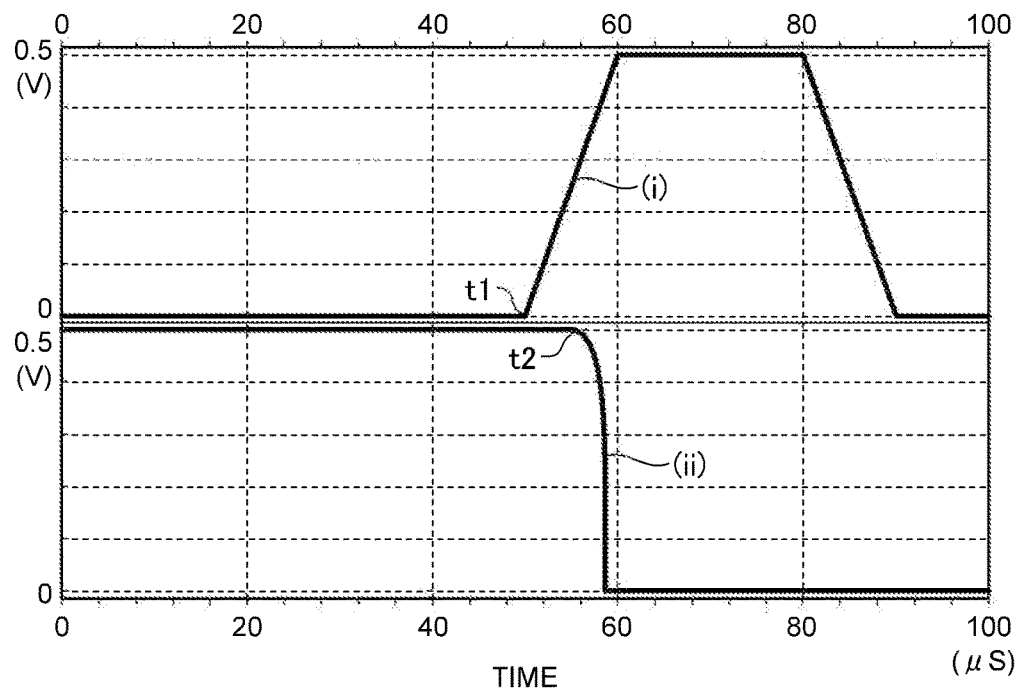
FIG. 3 illustrates the characteristics of the writing operation.

FIG. 3 illustrates the result of a simulation of the writing operation. Solid line (i) represents the voltage impressed on the write word-line 30. Solid line (ii) represents the change in voltage on the node 20. At the timing t1, a High-level voltage is impressed on the write word-line 30. In response to the impressed High-level voltage, the access transistor 15 is turned on, and thereby the voltage of the node 20 starts to decrease at the timing t2 to write Low-level data.

Figure 4:
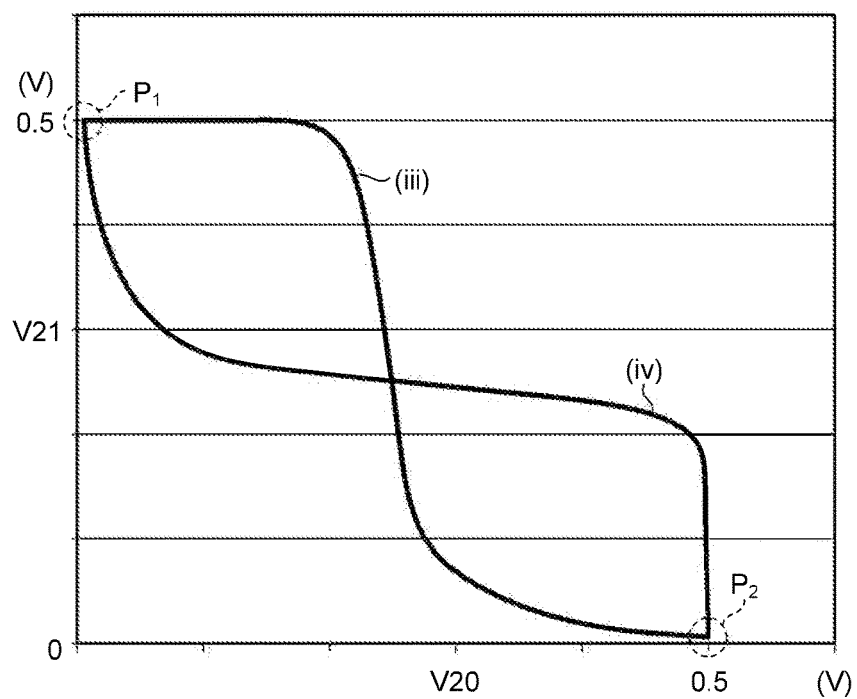
FIG. 4 is a figure for explaining the stability of the writing operation.

FIG. 4 illustrates a butterfly curve of an SRAM. The figure illustrates the result of a simulation where the power voltage VDD is set to 0.5 V. The curve (iii) represents the voltage on the node 20. The curve (iv) represents the voltage on the node 21. The horizontal axis represents the voltage on the node 20, and the vertical axis represents the voltage on the node 21. The butterfly curve illustrated in FIG. 4 has two stability points P1 and P2. Large areas enclosed between the curve (iii) and the curve (iv) indicate that the resistance against noise is large. The writing operation is performed with the access transistors 15 and 16, which are composed of NTFETs connected in a manner that a drain current flows from the nodes 20 and 21 to the write bit-lines 32 and 33, respectively, when turned on. The writing operation can thus be performed stably.

Figure 5:
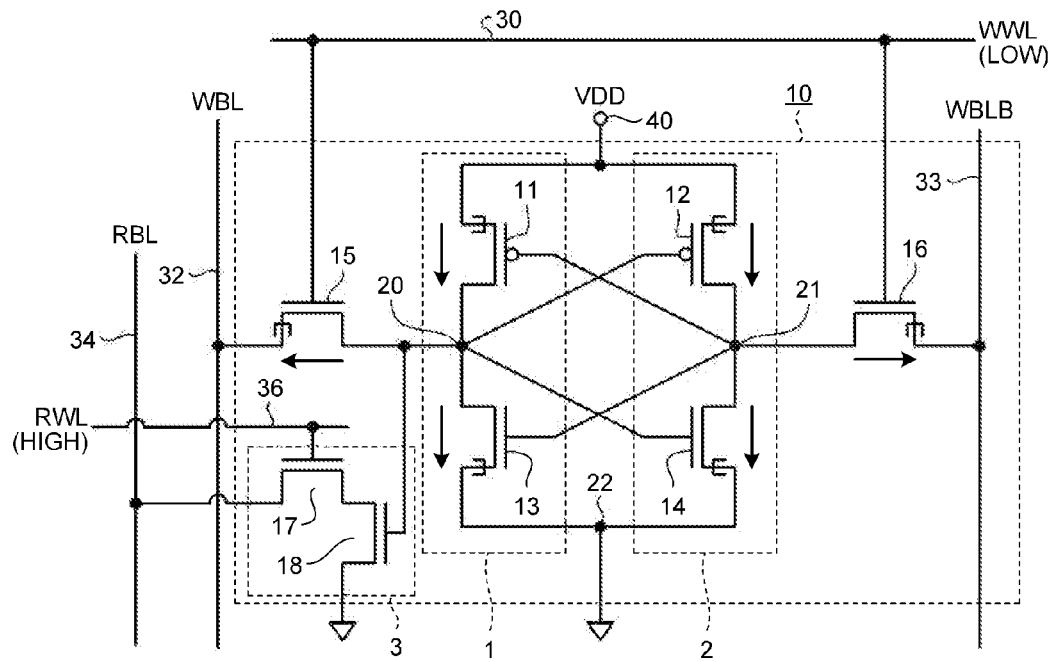
FIG. 5 is a figure for explaining a reading operation.

The reading operation will be described referring to FIG. 5. In the reading operation, a low-potential voltage, for example, the ground voltage VSS, is impressed on the write word-line 30. The access transistors 15 and 16, each having the gate connected to the write word-line 30, are thereby turned off.

A High-level voltage, for example, the power voltage VDD, is impressed on the read word-line 36. The NMOS transistor 17 having the gate connected to the read word-line 36 is thereby turned on. For example, when High-level data is held on the node 20, the NMOS transistor 18 is in the on-state, and thereby the voltage on the read bit-line 34 is reduced. By detecting the voltage on the read bit-line 34, the data held on the memory cell 10 can be readout.

By performing the readout of data using the MOS transistor circuit 3 configured with the NMOS transistors 17 and 18 having high driving ability, the operation of reading data can be performed with high speed.

Figure 6:
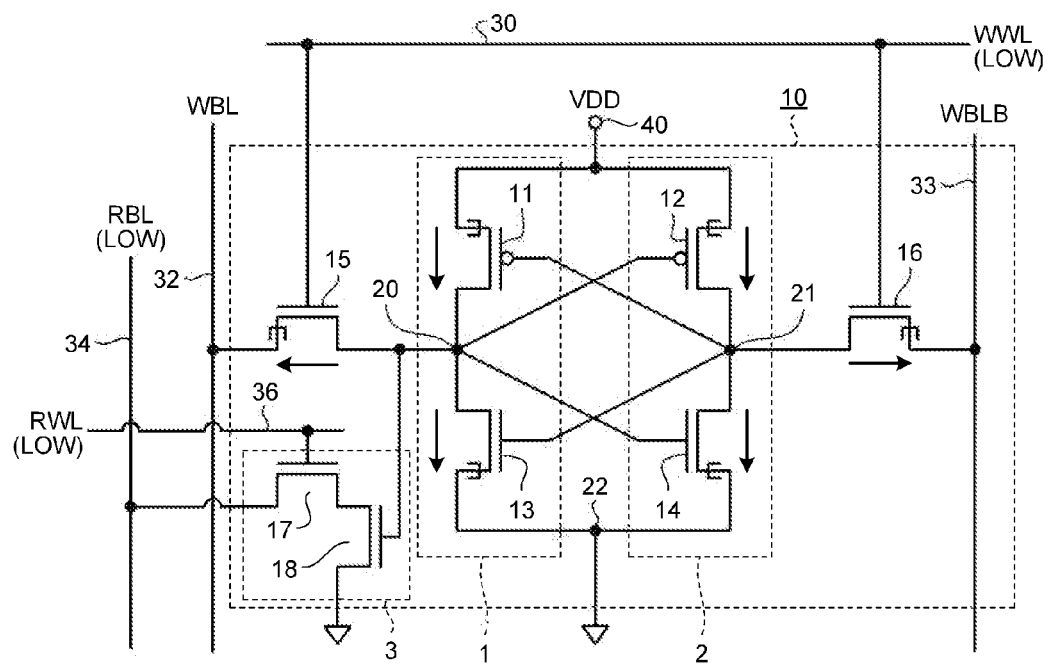
FIG. 6 is a figure for explaining a retention operation.

The retention operation of holding data is described referring to FIG. 6. In the retention operation, a Low-level voltage, for example, the ground voltage VSS, is impressed on the write word-line 30. The access transistors 15 and 16, each having the gate connected to the write word-line 30 are thereby turned off. Since each of the access transistors 15 and 16 is composed of an NTFET connected in a direction that a drain current flows from the nodes 20 and 21 to the write bit-lines 32 and 33, respectively, when turned on, the leakage current in the off-state is small.

In the retention operation, a Low-level voltage, for example, the ground voltage VSS, is impressed on the read word-line 36. The NMOS transistor 17 having the gate connected to the read word-line 36, is thereby turned off. A Low-level voltage, for example, the ground voltage VSS, is impressed on the read bit-line 34. The ground voltage VSS is thereby impressed on the source of the NMOS transistor 18 and the gate and the drain of the NMOS transistor 17. Therefore, no path of leakage current is formed in the NMOS transistor 17 and the NMOS transistor 18. In other words, even provided with the NMOS transistor 17 and the NMOS transistor 18 having high driving ability, the leakage current does not increase during the retention operation.

In the embodiment, the writing operation is performed with the access transistors 15 and 16 which are composed of NTFETs connected in a manner that a current flows from the nodes 20 and 21 to the write bit-lines 32 and 33, respectively, when turned on. Thus the writing operation can be performed stably. The reading operation is performed using the MOS transistor circuit 3 configured with the NMOS transistors 17 and 18 having high driving ability. The reading operation can thus be performed at high speed. In the retention operation, the access transistors 15 and 16, which are composed of NTFET connected to the write bit-lines 32 and 33, respectively, and the NMOS transistors 17 and 18 connected to the read bit-line 34 are turned off. By impressing a Low-level voltage, for example, the ground voltage VSS, on the read bit-line 34, that is, impressing the same voltage to the source of the NMOS transistor 18 and the drain of the NMOS transistor 17, the forming of the path of leakage current in the NMOS transistors 17 and 18 can be avoided. The semiconductor storage device with low leakage can thus be provided.

Second Embodiment

Figure 7:
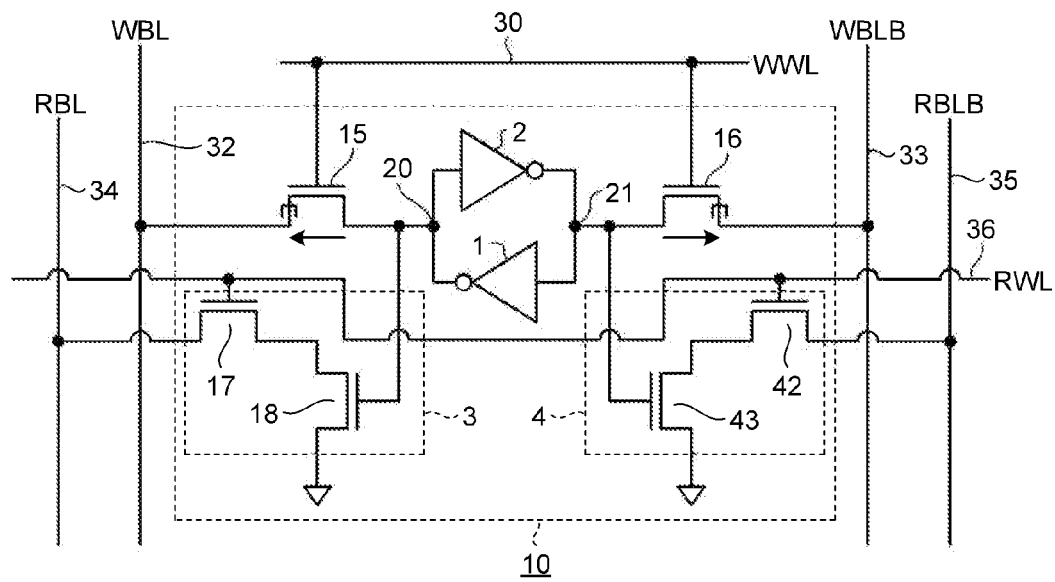
FIG. 7 illustrates a configuration of a memory cell of a semiconductor storage device according to a second embodiment.

FIG. 7 illustrates a configuration of a memory cell of a semiconductor storage device according to a second embodiment. The component corresponding to the embodiment described above is appended with the same reference sign. The memory cell 10 according to the embodiment includes a first read bit-line 34 and a second read bit-line 35. By providing a pair of read bit-lines, the speed of the reading operation can be raised. That is, the embodiment is configured to detect the voltage difference between the first read bit-line 34 and the second read bit-line 35 by a read circuit (not illustrated) in the reading operation, and to amplify and detect the slight voltage difference between the first read bit-line 34 and the second read bit-line 35. In this manner, the reading operation can be performed with high speed.

The memory cell 10 according to the embodiment includes a first MOS transistor circuit 3 which responds to a voltage impressed on the read word-line 36 and supplies a voltage corresponding to the voltage on the first node 20 to the first read bit-line 34. The first MOS transistor circuit 3 includes an NMOS transistor 17 having the drain connected to the first read bit-line 34. The source of the NMOS transistor 17 is connected to the drain of the NMOS transistor 18. The source of the NMOS transistor 18 is grounded. The gate of the NMOS transistor 17 is connected to the read word-line 36. The gate of the NMOS transistor 18 is connected to the node 20.

The memory cell 10 includes a second MOS transistor circuit 4 which responds to a voltage impressed on the read word-line 36 and supplies a voltage corresponding to the voltage on the second node 21 to the second read bit-line 35. The second MOS transistor circuit 4 includes an NMOS transistor 42 having the drain connected to the second read bit-line 35. The source of the NMOS transistor 42 is connected to the drain of the NMOS transistor 43. The source of the NMOS transistor 43 is grounded. The gate of the NMOS transistor 42 is connected to the read word-line 36. The gate of the NMOS transistor 43 is connected to the node 21.

In the embodiment, in the reading operation, a High-level voltage, for example, the power voltage VDD, is impressed on the read word-line 36. The NMOS transistors 17 and 42 each having the gate connected to the read word-line 36, are thereby turned on. For example, when High-level data is held on the node 20, the NMOS transistor 18 is in the on-state, and thereby the voltage on the first read bit-line 34 is reduced. Since the NMOS transistor 43 is in the off-state, the voltage of the second read bit-line 35 is maintained. By detecting the voltage difference between the first read bit-line 34 and the second read bit-line 35, the data held on the memory cell 10 can be readout. By performing the readout of data using the MOS transistor circuits 3 and 4 configured with the NMOS transistors 17, 18, 42, and 43 having high driving ability, the operation of reading data can be performed with high speed.

In the retention operation, a Low-level voltage, for example, the ground voltage VSS, is impressed on the read word-line 36. The NMOS transistor 17 and the NMOS transistor 42, each having the gate connected to the read word-line 36, are thereby turned off. A Low-level voltage, for example, the ground voltage VSS, is impressed on the first read bit-line 34 and the second read bit-line 35. The ground voltage VSS is thereby impressed on the source of the NMOS transistor 18 and the gate and the drain of the NMOS transistor 17, and no path of leakage current is formed in the NMOS transistor 17 and the NMOS transistor 18. Similarly, the ground voltage VSS is impressed on the source of the NMOS transistor 43 and the gate and the drain of the NMOS transistor 42, and no path of leakage current is formed in the NMOS transistor 42 and the NMOS transistor 43. In other words, even provided with the MOS transistor circuits 3 and 4 configured with the NMOS transistors 17, 18, 42, and 43 having high driving ability, the leakage current does not increase during the retention operation.

Third Embodiment

Figure 8:
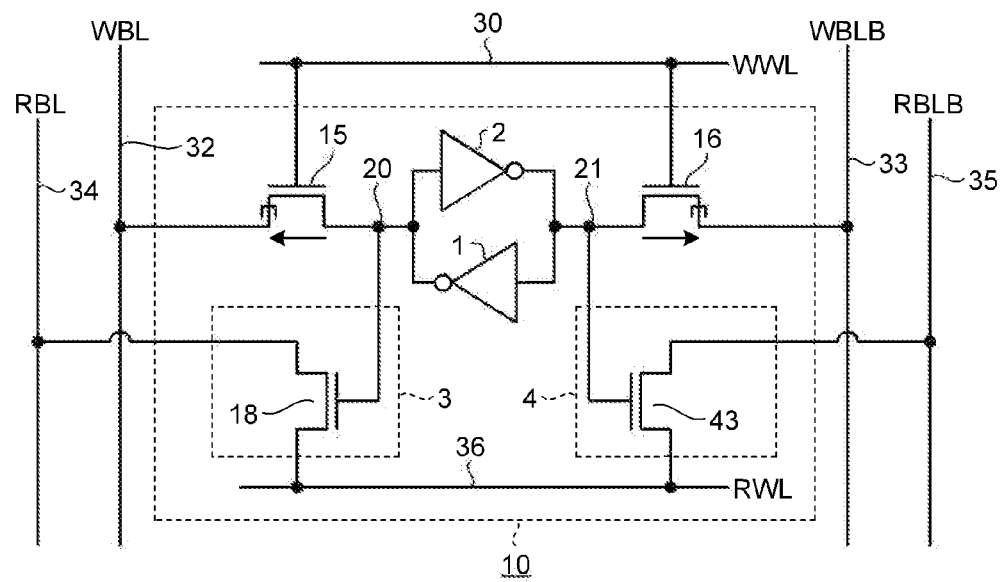
FIG. 8 illustrates a configuration of a memory cell of a semiconductor storage device according to a third embodiment.

FIG. 8 illustrates a configuration of a memory cell of a semiconductor storage device according to a third embodiment. The component corresponding to the embodiment described above is appended with the same reference sign. The memory cell 10 of the semiconductor storage device according to the embodiment includes a first MOS transistor circuit 3 which responds to a voltage impressed on the read word-line 36 and supplies a voltage corresponding to the voltage on the first node 20 to the first read bit-line 34. The first MOS transistor circuit 3 is configured with an NMOS transistor 18 having the gate connected to the first node 20, the drain connected to the first read bit-line 34, and the source connected to the read word-line 36.

The memory cell 10 of the semiconductor storage device according to the embodiment includes a second MOS transistor circuit 4 which responds to a voltage impressed on the read word-line 36 and supplies a voltage corresponding to the voltage on the second node 21 to the second read bit-line 35. The second MOS transistor circuit 4 is configured with an NMOS transistor 43 having the gate connected to the second node 21, the drain connected to the second read bit-line 35, and the source connected to the read word-line 36.

In the reading operation, a low-potential voltage, for example, the ground voltage VSS, is impressed on the write word-line 30. The access transistors 15 and 16, each composed of an NTFET having the gate connected to the write word-line 30, are thereby turned off. A low-potential voltage, for example, the ground voltage VSS, is impressed on the read word-line 36. For example, when High-level data is held on the node 20 and Low-level data is held on the node 21, the NMOS transistor 18 is in the on-state, and the voltage on the first read bit-line 34 is reduced and the voltage on the second read bit-line 35 is kept at a High-level. The readout of data is performed by detecting the voltage difference between the first read bit-line 34 and the second read bit-line 35. That is, the reading operation is performed using the NMOS transistors 18 and 43 having high driving ability.

In the retention operation, a Low-level voltage, for example, the ground voltage VSS, is impressed on the read word-line 36. A Low-level voltage, for example, the ground voltage VSS, is impressed on the first read bit-line 34 and the second read bit-line 35. The ground voltage VSS is thereby impressed on the source and the drain of the NMOS transistor 18 and the source and the drain of the NMOS transistor 43, and no path of leakage current is formed in the NMOS transistor 18 and the NMOS transistor 43. In other words, even provided with the NMOS transistors 18 and 43 having high driving ability, the leakage current does not increase during the retention operation.

The memory cell 10 of the semiconductor storage device according to the embodiment includes the NMOS transistors 18 and 43 having high driving ability which serve as access transistors for reading data held on the node 20 and the node 21. By performing the readout of data using the NMOS transistors 18 and 43 having high driving ability, the reading operation in the semiconductor storage device can be performed with high speed.

Fourth Embodiment

Figure 9:
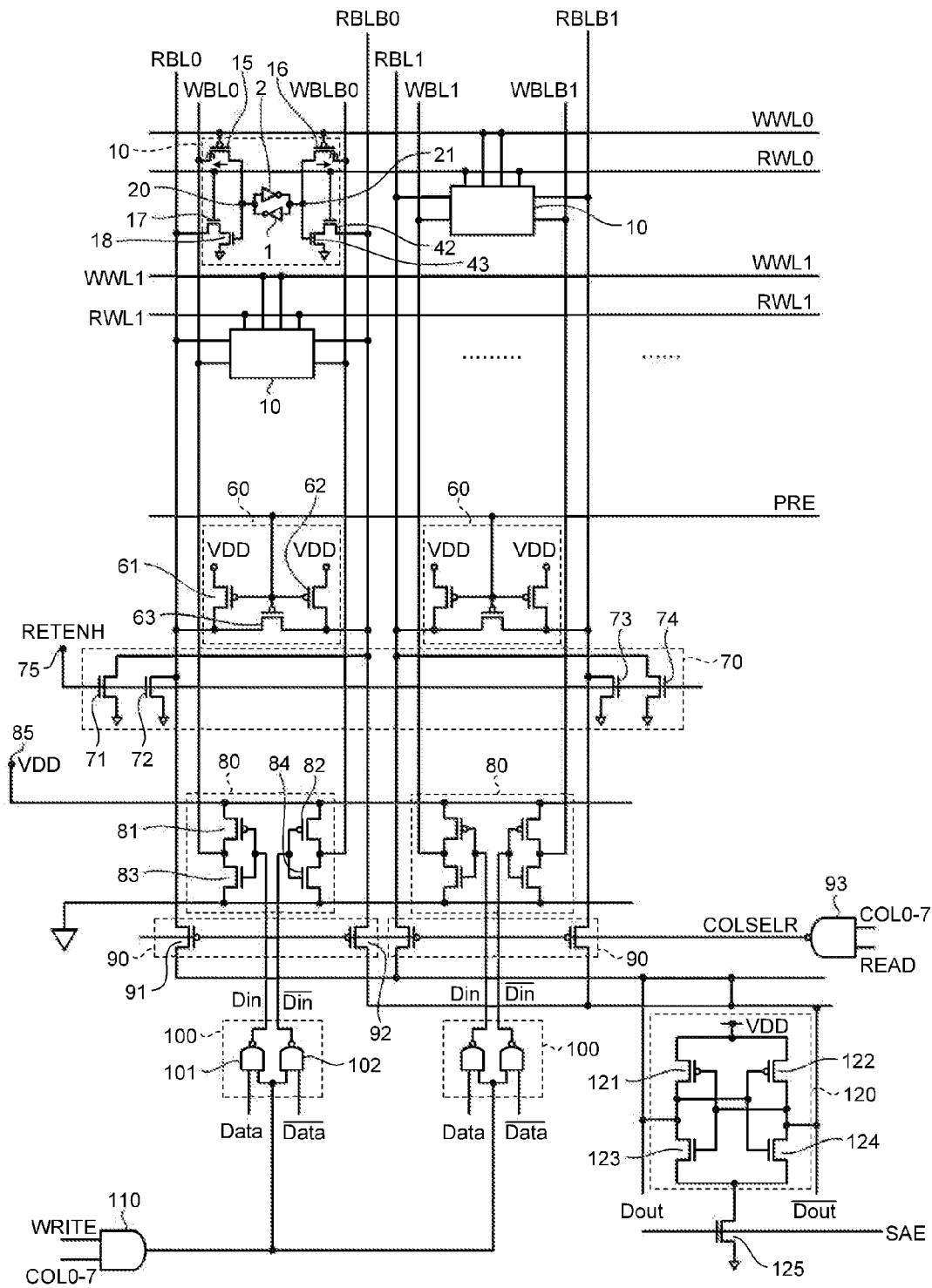
FIG. 9 illustrates a system configuration of a semiconductor storage device according to a fourth embodiment.

FIG. 9 illustrates a system configuration of a semiconductor storage device according to a fourth embodiment. The component corresponding to the embodiment described above is appended with the same reference sign. The semiconductor storage device according to the embodiment includes a plurality of write word-lines WWL0 and WWL1 and a plurality of read word-lines RWL0 and RWL1. The write word-lines WWL0 and WWL1 are connected to a write column decoder (not illustrated). A voltage to turn on the access transistors 15 and 16 is supplied to the write word-lines WWL0 and WWL1 in the writing operation. The read word-lines RWL0 and RWL1 are connected to a read column decoder (not illustrated). A voltage to turn on the NMOS transistors 17 and 42 is supplied to the read word-lines RWL0 and RWL1 in the reading operation.

The semiconductor storage device according to the embodiment includes a plurality of first write bit-lines WBL0 and WBL1 and a plurality of second write bit-lines WBLB0 and WBLB1. Similarly, a plurality of first read bit-lines RBL0 and RBL1 and a plurality of second read bit-lines RBLB0 and RBLB1 are included. A memory cell 10 connected to the first write bit-line WBL0 or WBL1, the second write bit-line WBLB0 or WBLB1, the first read bit-line RBL0 or RBL1, the second read bit-line RBLB0 or RBLB1, the write word-line WWL0 or WWL1, and the read word-line RWL0 or RWL1 is included. The memory cell 10 has, for example, the configuration same as that of the memory cell 10 described in the embodiment in FIG. 7.

The semiconductor storage device according to the embodiment includes a precharge and equalization circuit 60. The precharge and equalization circuit 60 responds to a precharge signal PRE. The precharge and equalization circuit 60 includes three PMOS transistors 61, 62, and 63.

The semiconductor storage device according to the embodiment includes a retention control circuit 70. The retention control circuit 70 includes NMOS transistors 71, 72, 73, and 74 each having the drain connected to the first read bit-line RBL0 or RBL1 or to the second read bit-line RBLB0 or RBLB1 and the source being grounded. In the retention operation, the retention control circuit 70 responds to a retention signal RETENH impressed on a terminal 75 to set the voltage on the first read bit-lines RBL0 and RBL1 and the second read bit-lines RBLB0 and RBLB1 to low-potential, for example, the ground voltage VSS. This can avoid the forming of the path of leakage current in the NMOS transistors 17, 18, 42, and 43 used for the reading operation, as described above.

The semiconductor storage device according to the embodiment includes a write circuit 80. The write circuit 80 includes transistors 81 and 83 constituting an inverter and transistors 82 and 84 constituting an inverter as well. The power voltage VDD impressed on a terminal 85 as a bias voltage of the write circuit 80. Inputs Din and /Din are supplied to the write circuit 80 via a gate circuit 100.

The gate circuit 100 includes two NAND circuits 101 and 102. Write-data-signals Data and /Data are supplied to the NAND circuits 101 and 102. An output signal from an AND circuit 110 is supplied to the common input terminal of NAND circuits 101 and 102. A write-control-signal WRITE and a column-selection-signal COL0-7 are supplied to the AND circuit 110.

The semiconductor storage device according to the embodiment includes a read circuit 90. The read circuit 90 includes two PMOS transistors 91 and 92. Responding to a read signal COLSELR supplied from the NAND circuit 93, the read circuit 90 connects the first read bit-lines RBL0 and RBL1 and the second read bit-lines RBLB0 and RBLB1 to a sense amplifier 120.

The sense amplifier 120 includes PMOS transistors 121 and 122 and NMOS transistors 123 and 124. A sense amplifier control-signal SAE is supplied to the gate of the NMOS transistor 125 connected between the sense amplifier 120 and the ground voltage VSS. The sense amplifier 120 is controlled by controlling on and off of the NMOS transistor 125 using the sense amplifier control-signal SAE. Signals amplified in the sense amplifier 120 are output as output signals Dout and /Dout.

The semiconductor storage device according to the embodiment includes a retention control circuit 70 which supplies a low-potential, for example, the ground voltage VSS, to the first read bit-lines RBL0 and RBL1 and the second read bit-lines RBLB0 and RBLB1 in the retention operation. In the retention operation, the retention control circuit 70 sets the voltage of the first read bit-lines RBL0 and RBL1 and the second read bit-lines RBLB0 and RBLB1 to, for example, the ground voltage VSS. In this manner, the ground voltage VSS is impressed on both ends of each of the source-drain path formed in the NMOS transistor 17 and the NMOS transistor 18 connected in series and the source-drain path formed in the NMOS transistor 42 and the NMOS transistor 43 connected in series. This avoids the forming of the path of leakage current in the NMOS transistor 17 and the NMOS transistor 18 as well as the NMOS transistor 42 and the NMOS transistor 43. Therefore, even when the NMOS transistors 17, 18, 42, and 43 having high driving ability are provided to be used for reading operation, the leakage current does not increase during the retention operation.

In the embodiment described above, the inverter 1 is configured with the PTFET 11 and the NTFET 13, and the inverter 2 is configured with the PTFET 12 and the NTFET 14. However, the configuration of the inverter is not limited to such configuration. For example, the inverter 1 may be configured only with the NTFET 13 without the PTFET 11, and the inverter 2 may be configured only with the NTFET 14 without the PTFET 12 as well, where the gate and drain of the NTFET 13 and the NTFET 14 are cross-connected to each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a first inverter configured with a tunnel transistor;
    a first node receiving an output from the first inverter;
    a second inverter configured with a tunnel transistor, wherein the second inverter receives the output from the first inverter and supplies an output to the first inverter;
    a second node receiving the output from the second inverter;
    a first access transistor having a source-drain path connected between the first node and a first write bit-line and a gate connected to a write word-line;
    a second access transistor having a source-drain path connected between the second node and a second write bit-line and a gate connected to the write word-line; and
    a first MOS transistor circuit configured to respond to a voltage impressed on a read word-line and supply a voltage corresponding to a voltage on the first node to a first read bit-line in a read operation, wherein
    the first MOS transistor circuit includes a first NMOS transistor having a gate connected to the first node and a source-drain path which supplies the voltage corresponding to the voltage on the first node to the first read bit-line in response to the voltage impressed on the read word-line,
    the first access transistor includes a tunnel transistor connected in a manner that a drain current flows from the first node to the first write bit-line when turned on in a forward biased state, and
    the second access transistor includes a tunnel transistor connected in a manner that a drain current flows from the second node to the second write bit-line when turned on in a forward biased state.

2. The semiconductor storage device according to claim 1, wherein
    the first MOS transistor circuit further includes a second NMOS transistor having a source-drain path connected to the source-drain path of the first NMOS transistor in series and a gate connected to the read word-line.

3. The semiconductor storage device according to claim 2, further comprising
    a retention control circuit that supplies a ground voltage to the first read bit-line in a retention operation.

4. The semiconductor storage device according to claim 1, wherein
    the first NMOS transistor has a source connected to the read word-line and a drain connected to the first read bit-line.

5. The semiconductor storage device according to claim 4, further comprising a retention control circuit that supplies a ground voltage to the first read bit-line in a retention operation.

6. The semiconductor storage device according to claim 1 further comprising
    a second MOS transistor circuit configured to respond to a voltage impressed on the read word-line and supply a voltage corresponding to a voltage on the second node to a second read bit-line, wherein the second MOS transistor circuit includes a second NMOS transistor having a gate connected to the second node and a source-drain path which supplies the voltage corresponding to the voltage on the second node to the second read bit-line in response to the voltage impressed on the read word-line.

7. The semiconductor storage device according to claim 6 wherein
    the second NMOS transistor has a source connected to the read word-line and a drain connected to the second read bit-line.

8. The semiconductor storage device according to claim 7, further comprising
    a retention control circuit that supplies a ground voltage to the second read bit-line in a retention operation.

9. The semiconductor storage device according to claim 6, wherein
    the second MOS transistor circuit includes a third NMOS transistor having a source-drain path connected to the source-drain path of the second NMOS transistor in series and a gate connected to the read word-line.

10. The semiconductor storage device according to claim 9, further comprising
    a retention control circuit that supplies a ground voltage to the second read bit-line in a retention operation.

11. A method of driving a semiconductor storage device, the semiconductor storage device including:
    a first inverter configured with a tunnel transistor;
    a first node receiving an output from the first inverter;
    a second inverter configured with a tunnel transistor, wherein the second inverter receives the output from the first inverter and supplies an output to the first inverter;
    a second node receiving the output from the second inverter;
    a first access transistor configured with a tunnel transistor having a source-drain path connected between the first node and a first write bit-line and a gate connected to a write word-line;
    a second access transistor configured with a tunnel transistor having a source-drain path connected between the second node and a second write bit-line and a gate connected to the write word-line; and
    a first MOS transistor circuit including a first NMOS transistor which has a gate connected to the first node and a source-drain path which supplies a voltage corresponding to a voltage on the first node to a first read bit-line in a read operation, and is configured to respond to a voltage impressed on a read word-line, wherein
    the method of driving the semiconductor storage device comprises:
    applying a first voltage to the write word-line to turn on the first and second access transistors in a write operation to write data into the first and second nodes;
    applying a second voltage different from the first voltage to the write word-line to turn off the first and second access transistors in the read operation to read the data written in the first and second nodes;
    applying a voltage to the read word-line to read the data written in the first node in the read operation to supply the voltage corresponding to the voltage on the first node to the first read bit-line through the source-drain path of the first NMOS transistor; and applying a voltage same as a voltage impressed on a source of the first NMOS transistor to the first read bit-line in a retention operation to hold the data written in the first and second nodes.

12. The method of driving a semiconductor storage device according to claim 11, wherein the applying the voltage to the first read-bit line includes applying a ground voltage to the first read bit-line in the retention operation.

13. The method of driving a semiconductor storage device according to claim 11, wherein the first MOS transistor circuit includes a second NMOS transistor having a source-drain path connected between the source-drain path of the first NMOS transistor and the first read bit-line and a gate connected to the read word-line, and the method further comprises:
applying a voltage for turning off the second NMOS transistor to the read word-line in the write operation;
applying a voltage for turning on the second NMOS transistor to the read word-line in the read operation; and
applying a voltage for turning off the second NMOS transistor to the read word-line in the retention operation.

14. The method of driving a semiconductor storage device according to claim 13, further comprising applying a voltage to the write word-line to turn off the first and second access transistors in the retention operation.

15. The method of driving a semiconductor storage device according to claim 11, further comprising applying a voltage on the read word-line to the source of the first NMOS transistor to read the data written in the first and second nodes.

16. The method of driving a semiconductor storage device according to claim 15, further comprising applying a ground voltage to the read word-line in the retention operation.

17. The method of driving a semiconductor storage device according to claim 16, further comprising applying a ground voltage to the first read-bit line in the retention operation.

18. The method of driving a semiconductor storage device according to claim 11, wherein the semiconductor storage device includes a second MOS transistor circuit including a second NMOS transistor which has a gate connected to the second node and a source-drain path which supplies a voltage corresponding to a voltage on the second node to a second read bit-line in the read operation, and is configured to respond to the voltage impressed on the read word-line, and the method further comprises applying the voltage on the read word-line to the source of the second NMOS transistor.

19. The method of driving a semiconductor storage device according to claim 18, further comprising applying a ground voltage to the second read bit-line in the retention operation.

20. The method of driving a semiconductor storage device according to claim 19, further comprising applying the ground voltage to the read word-line in the retention operation.

* * * * *